Oct. 27, 1964 W. G. LEE 3,154,478

CHEMICAL NICKEL PLATING PROCESSES AND BATHS AND METHODS OF MAKING PRINTED ELECTRIC CIRCUITS

Filed Nov. 4, 1957

INVENTOR.
Warren G. Lee

BY

Smith, Prangley, Baird & Clayton
Attys.

United States Patent Office 3,154,478

Patented Oct. 27, 1964

3,154,478

CHEMICAL NICKEL PLATING PROCESSES AND BATHS AND METHODS OF MAKING PRINTED ELECTRIC CIRCUITS

Warren G. Lee, East Chicago, Ind., assignor to General American Transportation Corporation, Chicago, Ill., a corporation of New York Filed Nov. 4, 1957, Ser. No. 694,303
13 Claims. (Cl. 204—38)

The present invention relates generally to chemical nickel plating of non-metallic bodies, and particularly to processes of and baths for the chemical nickel plating of such bodies, and specifically to printed electric circuits and methods of making the same. This application is a continuation-in-part of the copending application of Warren G. Lee, Serial No. 500,641, filed April 11, 1955, now abandoned; and the last-mentioned application is a continuation-in-part of the application of Warren G. Lee, Serial No. 478,978, filed December 31, 1954, now abandoned.

In accordance with a conventional method of making a printed electric circuit, an adhesive layer (a resin-rubber base type layer) is applied to a previously sheared and punched insulating board (a laminate comprising a textile reinforced thermoset resin consisting essentially of phenol-formaldehyde condensation products), and thereover a thin coating of metallic silver is laid down (employing a silk screen step for pattern-control) by applying an aqueous solution of a silver salt and a reducing agent. Thereafter hollow rivets or eyelets are secured into the holes previously punched in the board in order to provide terminals for the circuit elements of the printed electric circuit.

This conventional method of making printed electric circuits is subject to several serious drawbacks:

(*a*) The silver coating does not always adhere properly;

(*b*) The rivets or eyelets employed as electrical terminals do not always make good electrical contact with the circuit elements and also require an assembly operation; and (*c*) The silver ions migrate through the adhesive layer and through the insulating board, after a time interval, thereby impairing the dielectric properties of the insulating board, so as to render inoperative capacitative circuit elements of the printed electric circuit.

Accordingly, it is a general object of the invention to provide improved methods of chemical nickel plating and of making printed electric circuits that are not subject to the drawbacks noted.

Another object of the invention is to provide an improved chemical nickel plating method that is particularly adapted for use in making printed electric circuits, or the like.

Another object of the invention is to provide an improved method of making a printed electric circuit that employs no silver or other expensive electrical conducting materials.

A further object of the invention is to provide an improved process of producing a copper layer upon the surface of a solid non-metallic body, employing an intervening layer of nickel-phosphorus alloy, wherein the alloy layer is intimately bonded to the surface of the non-metallic body and the copper layer is intimately bonded to the alloy layer.

Another general object of the invention is to provide an improved process of chemical nickel plating that involves an improved chemical nickel strike bath that may be employed at room temperature.

A further object of the invention is to provide an improved chemical nickel strike bath that is usable at room temperature.

Further features of the invention pertain to the particular arrangement of the elements of the printed electric circuit and of the steps of the method of making the same, whereby the above-outlined and additional operating features thereof are attained.

The invention, both as to its organization and principle of operation, together with further objects and advantages thereof, will best be understood by reference to the following specification taken in connection with the accompanying drawing, in which.

In FIGS. 2, 4, 6, 8, 10 and 12, the thickness of the board, the layers, etc., have been greatly exaggerated; and in FIGS. 5, 7, 9 and 11, the thickness of the outlines of the resistor and the capacitor have been greatly exaggerated; these exaggerated dimensions being so employed for the purpose of better illustration.

Figure 11:
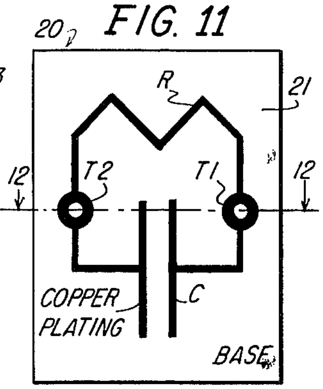
FIG. 11 is a plan view of the board of FIG. 9 after the exposed portion of the alloy layer has been dissolved and removed therefrom, and consequently the finished printed electric circuit.
Figure 12:
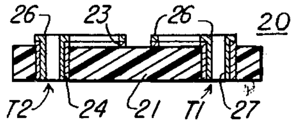
FIG. 12 is a vertical sectional view of the finished printed electric circuit taken in the direction of the arrows along the line 12—12 in FIG. 11.

Referring now to the drawing, the construction and arrangement of the printed electric circuit will best be understood from the following description of the method of making the same; however, it is noted that the finished printed electric circuit 20 is shown in FIGS. 11 and 12 as comprising an insulating board 21 carrying on the front surface thereof a printed circuit consisting of a resistor R and a capacitor C connected in parallel relation between a pair of electrical terminals T1 and T2. The parallel connection of the circuit elements R and C has no particular significance, it being employed entirely for purpose of description, and the circuit elements that are normally carried upon the rear surface of the insulating board 21 are omitted in the interest of simplicity of disclosure, since the present invention is directed to the structure of the printed electric circuit and the method of making the same, as contrasted with the composition of the printed electric circuit as employed ultimately in an electrical device, such as a radio-set, a television-set, an electric control panel, etc.

Figure 1:
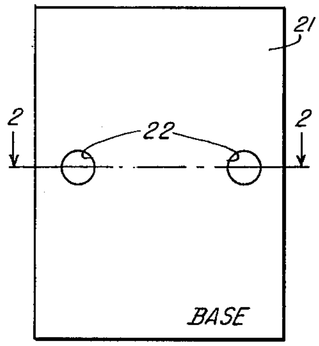
FIGURE 1 is a plan view of a sheet of insulating board after it has been sheared and a pair of holes have been pierced therethrough, and comprising the supporting element of a printed electric circuit.
Figure 2:
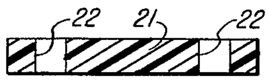
FIG. 2 is a vertical sectional view of the board taken in the direction of the arrows along the line 2—2 in FIG. 1.

Turning now to the method of making the printed electric circuit 20 and referring to FIGS. 1 and 2, first there is provided a sheared and pierced insulating board 21 that may comprise a laminate in the form of a textile reinforced thermoset resin, such, for instance, as phenol-formaldehyde condensation products. As illustrated, the board 21 is of substantially rectangular form and has a pair of spaced-apart holes 22 pierced therethrough, the board 21 having an appropriate thickness for purpose of support.

The front surface of the board 21 and the surfaces thereof surrounding the holes 22 therein are then prepared by a freshening step; which step may involve sanding, blasting, brushing, grinding, buffing, abrading, chemical etching, etc., so as to remove the "outer skin" thereof in order to eliminate any polarization of the surfaces thereof. This step produces the required surface-roughening and removal of the outside resin film from the surfaces mentioned of the board 21. Specifically, "vapor blasting" of these surfaces of the board 21 may be employed; and thereafter the board 21 is rinsed in tap water for about 5 minutes at about 60° C. Then the surfaces mentioned of the board 21 are subjected to a vapor degreasing step; and then cleaned, for instance in a mild alkaline solution that may contain some detergent and some sodium carbonate. Again, the board 21 is rinsed in tap water for about 5 minutes at about 60° C. Then the surfaces mentioned of the board 21 are acidified in an aqueous solution containing 10–20% sulfuric acid for a short time interval of about 1 to 5 minutes. Again the board 21 is rinsed as before; and next, the surfaces mentioned of the board 21 are activated in an aqueous palladium chloride solution containing about 1000 p.p.m. of $Pd^{++}$ for a time interval of about 15 to 20 minutes. This aqueous solution may contain palladium chloride in an amount of about 1.66 gms./liter. The board 21 is then dried in an oven, or with infra-red radiation, at about 80° C. for a short time interval. Next, the board 21 is immersed in a reducing solution, such, for example, as an aqueous solution containing about 0.15 m.p.l. of sodium hypophosphite or hypophosphorous acid, the immersion time being about 2 minutes. The board 21 is rinsed for 15 seconds and then immersed in an aqueous nickel strike bath at room temperature (about 70° F.) for about 10–20 minutes. The rinsing of the board 21 preceding the immersion thereof in the aqueous nickel strike bath is very important as it prevents decomposition of the nickel strike bath by the carrying over with the board 21 of adsorbed $Pd^{++}$ ions.

The nickel strike bath may have the approximate composition.

| Ingredient: | Mole/liter |
|---|---|
| $NiSO_4.6H_2O$ | 0.09 |
| $NaH_2PO_2$ | 0.225 to 0.360 |
| $H_3BO_3$ | 0.02 |
| $(NH_4)_2SO_4$ | 0.09 |

The pH of this nickel strike bath is adjusted within the approximate range 5.5 to 7.0 with $NaHCO_3$ and $H_2SO_4$ prior to use. The plating rate of this nickel strike bath is about 0.05 mil/hour.

Next, the board 21 is rinsed in tap water, and is then pickled in sulfuric acid (10%) for about 30 seconds; and again, the board 21 is rinsed as before.

Then the board 21 is subjected to chemical nickel plating in a chemical nickel plating bath at about 200° F.–210° F. to obtain the desired thickness of the nickel layer deposited thereon (4 minutes being generally sufficient), this chemical nickel plating bath having a plating rate of about 0.9 to 1.0 mil/hour.

The most suitable chemical nickel plating bath comprises an aqueous solution and may have the approximate composition:

| | M.p.l. |
|---|---|
| Nickel sulfate | 0.09 |
| Sodium hypophosphite | 0.225 |
| Malic acid | 0.18 |
| Sodium succinate | 0.06 |

Prior to use, the pH of this bath should be adjusted in the approximate range 5.8 to 6.0 employing sulfuric acid or sodium hydroxide, as required.

Another suitable chemical nickel plating bath comprises an aqueous solution and may have the approximate composition:

| | M.p.l. |
|---|---|
| Nickel sulfate | 0.07 |
| Sodium hypophosphite | 0.23 |
| Lactic acid | 0.30 |
| Propionic acid | 0.03 |

Prior to use, the pH of this bath should be adjusted in the approximate range 4.5 to 4.7 employing sulfuric acid or sodium hydroxide, as required.

While either of the two above-described chemical nickel plating baths are entirely satisfactory for the chemical nickel plating of the prepared surfaces of the board 21, the malic-succinate bath first described is preferred since the adhesion of the nickel deposit is considerably greater employing this bath.

The above-described process of chemical nickel plating upon the surface of a non-metallic body is covered by U.S. Patent Nos. 2,690,401 and 2,690,402, granted on September 28, 1954, respectively, to Gregoire Gutzeit, William J. Crehan and Abraham Krieg, and to William J. Crehan.

After the last-mentioned chemical nickel plating step, the board 21 is removed to an oven and heat-treated at a temperature of about 325° F. for a time interval of about 30 minutes in order to effect thorough drying and degassing thereof.

Figure 3:
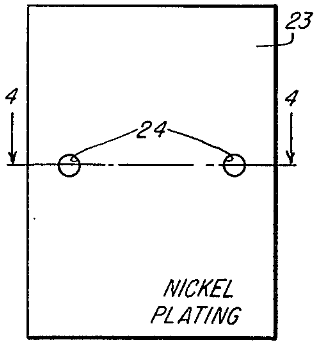
FIG. 3 is a plan view of the board of FIG. 1 after a layer of nickel-phosphorus alloy has been chemically plated upon the upper surface thereof and upon the surfaces thereof surrounding the pair of holes therein to define a pair of electrical terminals in the respective holes therein.
Figure 4:
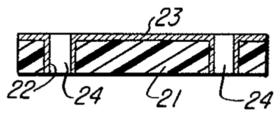
FIG. 4 is a vertical sectional view of the board taken in the direction of the arrows along the line 4—4 in FIG. 3.

At this time, the previously prepared surfaces of the board 21 carry, as shown in FIGS. 3 and 4, the layers of nickel 23 and 24 that have been chemically plated thereupon, the layer 23 being disposed upon the front surface of the board 21 and the layers 24 being respectively disposed upon the surfaces of the board 21 surrounding the holes 22 therein, the layers 23 and 24 being integral and intimately bonded to the prepared surfaces mentioned of the board 21. In the foregoing description of the integral layers 23 and 24, reference has been made to these layers as being formed of nickel; whereas, in fact, they comprise an alloy of nickel and phosphorus, the alloy containing about 5 to 11% phosphorus by weight. In other words, the chemical nickel plating process described above automatically and inherently results in the plating upon the prepared surfaces of the layers 23 and 24 that comprise the nickel-phosphorus alloy mentioned. Accordingly, hereinafter the layers 23 and 24 will be referred to as "alloy layers;" it being understood that the alloy referred to is the nickel-phosphorus alloy mentioned.

Recapitulating, the surfaces mentioned of the board 21 are prepared by roughening and cleaning so as to render them non-polarized; and thereafter upon immersion of the board 21 in the aqueous palladium chloride solution minute quantities of palladium chloride adhere to the prepared surfaces mentioned. Thereafter, when the board 21 is immersed in the aqueous chemical reducing solution these minute quantities of palladium chloride are reduced to metallic palladium so as to provide dispersed minute metallic palladium particles secured to the fresh non-polarized surfaces mentioned. Subsequently, upon immersion of the board 21 into the aqueous chemical nickel strike bath, a nickel strike takes place upon these particles; and still subsequently upon immersion of the board 21 into the aqueous chemical nickel plating bath, an alloy plating takes place upon these plated particles, which serve as growth nuclei, so that the thin continuous integral alloy layers 23 and 24 are produced upon the fresh non-polarized surfaces mentioned of the board 21; which integral layers 23 and 24 are intimately and tenaciously bonded to the surfaces mentioned.

Figure 5:
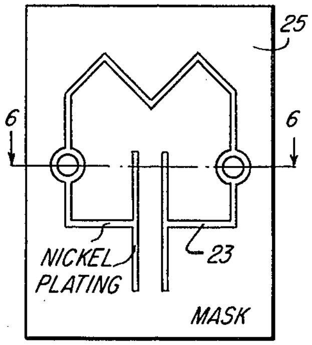
FIG. 5 is a plan view of the board of FIG. 3 carrying an electrically insulating organic masking layer upon the upper surface of the alloy layer, the masking layer having openings therein depicting the outlines of a resistor and a capacitor extending between the pair of terminals carried thereby.
Figure 6:
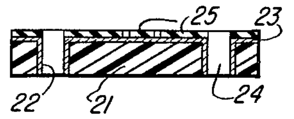
FIG. 6 is a vertical sectional view of the board taken in the direction of the arrows along the line 6—6 in FIG. 5.

Next, the front surface of the board 21 is prepared for subsequent electroplating; and more particularly an electrical insulating organic masking layer 25 is laid down upon the alloy layer 23, employing a conventional silk screen technique and utilizing a conventional silk screen organic masking material that is insoluble in water and aqueous acid solutions, but is soluble in organic solvents. For example, the usual silk screen masking enamel is insoluble in water and in aqueous acid solutions, but is readily soluble in methyl ethyl ketone. Specifically, the masking layer 25 is laid down through the silk screen so as to define or depict upon the alloy layer 23 the outlines of the electrical circuit elements of the finished printed electric circuit. By way of illustration, the masking layer 25 depicts the outlines of the resistor R and the capacitor C connected in parallel relationship between the pair of electrical terminals T1 and T2, as shown in FIGS. 5 and 6.

After the masking layer 25 has been laid down upon the alloy layer 23 employing the conventional silk screen technique noted, it is then suitably dried; and thereafter the exposed surfaces of the alloy layer 23 are suitably cleaned. Then the board 21 is transferred to conventional electroplating equipment, including a copper electrode, and subjected to electroplating operations, the board 21 being immersed in an appropriate copper electroplating bath. Specifically, the alloy layer 23 is first subjected to a reverse current for about 30 to 60 seconds, in order to activate the same, the alloy layer 23 constituting the anode and the copper electrode consituting the cathode. After this activation, the alloy layer 23 is subjected to forward current in a conventional manner, the alloy layer 23 constituting the cathode and the copper electrode constituting the anode.

While a standard cyanide electroplating bath may be employed, the electroplating bath set forth below is even more advantageous in view of the circumstance that it is productive of a copper layer that is very tenaciously bonded to the alloy layer, as more fully explained hereinafter, the electroplating bath mentioned comprising an aqueous solution and having the approximate composition:

| | | |
|---|---|---|
| $Cu(SO_4).5H_2O$ | gm./l. | 188 |
| $H_2SO_4$ conc. (66°Bé.) | cc./l. | 61.5 |
| Thiourea | gm./l. | 0.01 |
| Black strap molasses | gm./l. | 0.8 |
| Wetting agent | p.p.m. | 25 |

In passing, it is noted that after preparation of the electroplating bath mentioned, it should be filtered in order to remove therefrom any sediment; and also it is mentioned that any suitable wetting agent, such as the sodium salt of a sulfonated alkyl substituted aryl compound may be employed.

In the electroplating step, a current density of about 20–70 amps/sq. ft. (0.7–2 v.) may be employed with constant agitation of the electroplating bath.

Figure 7:
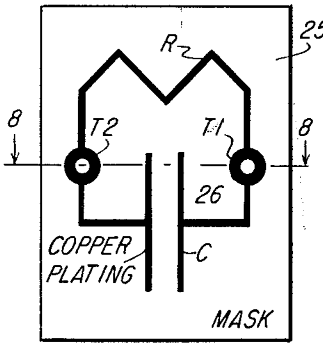
FIG. 7 is a plan view of the board of FIG. 5 after a copper layer has been electroplated upon the surfaces of the alloy layer that are exposed through the openings in the masking layer and upon the exposed surfaces of the pair of terminals, whereby the resistor and the capacitor are electrically connected in parallel relation between the pair of terminals.
Figure 8:
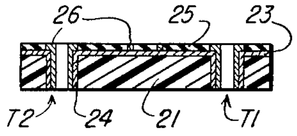
FIG. 8 is a vertical sectional view of the board taken in the direction of the arrows along the line 8—8 in FIG. 7.

At this time, the board 21 carries, as shown in FIGS. 7 and 8, the layer of copper 26 upon the exposed surfaces of the alloy layer 23 and the layers of copper 26 upon the exposed surfaces of the alloy layers 24, the copper layers 26 and 27 being integral with each other and intimately bonded to the respective alloy layers 23 and 24. Accordingly, the copper layer 26 defines the resistor R and the capacitor C, while the copper layers 27, together with the alloy layers 24, define the terminals T1 and T2.

The masking layer 25 is then dissolved and removed from the alloy layer 23 employing a suitable organic solvent, such, for example, as methyl ethyl ketone.

Figure 9:
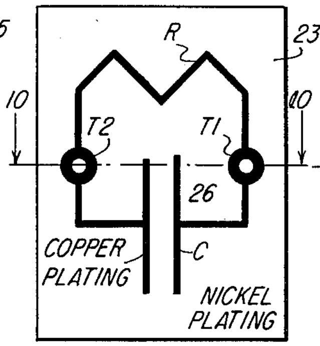
FIG. 9 is a plan view of the board of FIG. 7 after the masking layer has been dissolved and removed therefrom.
Figure 10:
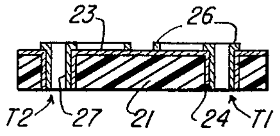
FIG. 10 is a vertical sectional view of the board taken in the direction of the arrows along the line 10—10 in FIG. 9.

At this time, the outlines of the resistor R and the capacitor C stand out in relief upon the alloy layer 23, as shown in FIGS. 9 and 10.

The exposed portions or surfaces of the alloy layer 23 are then dissolved and removed from the front surface of the board 21 employing a suitable mineral acid wash, such for example, as 1:1 nitric acid or 1:1 aqua regia or 2 parts sulfuric, 1 part nitric and ¼ part water.

Ultimately the board 21 may be sheared to any configuration that may be required in the utilization of the printed electric circuit, if a configuration of the board 21 is required other than the initial rectangular configuration thereof.

At this time, the finished printed electric circuit is produced, as shown in FIGS. 11 and 12, whereby it will be understood that the terminals T1 and T2 comprise the composite of the residual alloy layers 24 and the copper layers 26 and 27; while the circuit elements R and C comprise the composite of the residual alloy layer 23 and the copper layer 26. Moreover, the circuit elements R and C are connected in parallel relation between the terminals T1 and T2, while the terminals mentioned are securely anchored in place in the holes 22 formed in the insulating board 21.

In the finished printed electric circuit 20, the circuit elements R and C are firmly anchored upon the front surface of the insulating board 21 and are integrally united with the terminals T1 and T2 thereby to provide a printed electric circuit having predetermined and fixed electrical characteristics throughout its useful long operating life. Furthermore, it will be understood that any circuit elements that may be carried upon the rear surface of the insulating board 21 are formed thereon simultaneously with the formation of the circuit elements R and C on the front surface of the insulating board 21, as described above, and that any interconnections required between the circuit elements respectively carried upon the front and rear surfaces of the insulating board 21 are accomplished through the terminals T1, T2, etc., whereby the interconnected circuit elements carried on the respective surfaces of the insulating board 21 are integrally united by the terminals T1, T2, etc. The construction and arrangement of the printed electric circuit is disclosed and claimed in the copending application of Warren G. Lee, Serial No. 651,985, filed April 10, 1957, now U.S. Patent No. 2,940,018.

In the foregoing example, the chemical nickel plating process was described as a step in the method of making the printed electric circuit, and it is indeed ideally suited to this method, but it will be understood that this process is in no way peculiar to this method. More particularly, the chemical nickel plating process is of general utility in the nickel plating of a wide variety of non-metallic bodies formed of such materials as: natural and synthetic plastics, wood, quartz, glass, ceramics, etc. Moreover, since the nickel strike bath described is employed at room temperature, the synthetic plastic materials may be either of the thermosetting class (phenol-aldehyde resins, polyalcohol-phthalic resins, urea-formaldehyde resins, etc.) or of the thermoplastic class (vinyl polymers, styrol resins, cellulose derivatives, casein materials, superpolyamides, acrylate polymers, etc.).

Considering now more particularly the aqueous chemical nickel strike bath, it is noted that while the optimum composition thereof is that previously set forth, the preferred composition thereof is as follows:

(1) Nickel ions—an absolute concentration in the approximate range: 0.06 to 0.20 mole per liter.
(2) Hypophosphite ions—a molar ratio between nickel ions and hypophosphite ions in the approximate range: 0.2 to 0.6.
(3) Ammonium ions—an absolute concentration in the approximate range: 0.04 to 0.20 mole per liter.
(4) Ortho-boric acid—an absolute concentration in the approximate range: 0.015 to 0.030 mole per liter.
(5) pH—within the range 5.5 to 7.0, adjust with sodium bicarbonate or sulfuric acid, as required.

In preparing this nickel strike bath, the utilization of nickel hypophosphite is very convenient as it automatically establishes a ratio between nickel ions and hypophosphite ions of 0.5, but other soluble nickel salts (nickel sulfate, nickel chloride, etc.) may be used in conjunction with other soluble hypophosphites (sodium hypophosphite, calcium hypophosphite, potassium hypophosphite, etc.).

Similarly, the ammonium ions may be derived from a wide variety of soluble ammonium compounds (ammonium sulfate, ammonium chloride, ammonium hydroxide, etc.), as it will be appreciated that it is the ammonium radical of this ingredient that is useful as a weak alkali to neutralize the boric acid, thus forming a buffer active in the proper pH region.

While there are a few soluble ortho-borates, other than ortho-boric acid, that might be used in preparing the strike bath, there is no point to the use thereof, since the ortho-borate ions immediately hydrolyze in the aqueous solution:

$$(BO_3^{---}+2H_2O \rightarrow H_2BO_3^{-}+2OH^{-})$$

to produce exactly the same borate ions that result from the use of ortho-boric acid in the aqueous solution:

$$(H_3BO_3 \rightarrow H^{+}+H_2BO_3^{-})$$

Now in the aqueous bath, the boric acid serves as a buffer, and the concentration thereof should be low, since the buffering action thereof increases with dilution in the range mentioned.

Furthermore, the surface of the insulating board, or other article, to be plated with the nickel-phosphorus alloy may be conveniently activated with any one of the catalytic elements, other than palladium, as described above. Specifically, the following elements are catalytic to the dehydrogenation of the hypophosphite ion: cobalt, nickel, palladium, rhodium and ruthenium. This reaction is involved in the plating process and may be written as follows:

$$\text{(I)} \qquad (H_2PO_2)^{-} \xrightarrow[\text{catalyst}]{-2H} (PO_2)^{-}$$

The other fundamental reactions involved in the plating process are:

$$\text{(II)} \qquad (PO_2)^{-} + H_2O \longrightarrow H(HPO_3)^{-}$$

$$\text{(III)} \qquad 2H\ (\text{catalyst}) + Ni^{++} \longrightarrow Ni^{\circ} + 2H^{+}$$

$$\text{(IV)} \qquad 2H \longrightarrow H_2\uparrow$$

Accordingly, any suitable soluble salt of any one of the catalytic elements named (cobalt, nickel, palladium, rhodium and ruthenium) may be employed to produce the aqueous activating solution described.

This chemical nickel strike bath was expressly composed for operation at or near room temperature (70° F. to 75° F.) and is thermally unstable at temperatures substantially thereabove; whereby the upper temperature limit thereof is about 85° F. As the temperature of the bath is reduced below room temperature, the plating or striking rate falls off substantially, whereby the lower temperature limit is about 50° F. from a practical standpoint. The relationship between temperatures and plating rates of the bath are about as follows:

| | Mil/hr. |
|---|---|
| 50° F. | 0.03 |
| 70° F. | 0.04 |
| 85° F. | 0.05 |

While the pH of the chemical nickel strike bath may vary considerably, as far as operability is concerned, the stability thereof is impaired at high pH and the plating rate is impaired at low pH; whereby, from the operating range of pH—5.0 to 12.0, it is recommended that only the narrow band of pH—5.5 to 7.0 be used, and that the specific pH—5.8 be employed as a practical matter.

Also, a mild exalting additive may be advantageously included in the chemical nickel strike bath for the purpose of increasing or exalting the plating rate thereof, such, for example, as ions of a simple short chain saturated aliphatic monocarboxylic acid selected from the group consisting of acetic, propionic, butyric and valeric acids. For example, sodium acetate is appropriate for the present purpose; and when it is included in the bath, a content thereof in the general range 0.03 to 0.15 mole/liter is recommended, a content of 0.06 mole/liter being quite satisfactory. The acetate ions also serve as a buffer, as well as an exaltant, and they may be derived from a wide variety of soluble acetates (acetic acid, sodium acetate, calcium acetate, nickel acetate, etc.). Since the acetate ions serve as a buffer, the ammonium ion content of the bath may be reduced somewhat, when the acetate ions are included therein.

A typical chemical nickel strike bath, also containing acetate ions as an exaltant and as a buffer, may have the approximate composition.

| Ingredient: | Mole/liter |
|---|---|
| $Ni(H_2PO_2)_2$ | 0.09 |
| $H_3BO_3$ | 0.02 |
| $(NH_4)_2SO_4$ | 0.02 |
| $NaC_2H_3O_2$ | 0.06 |

The pH of this nickel strike bath is adjusted within the approximate range 5.5 to 7.0 prior to use, $H_2SO_4$ or NaOH being employed, as required. The plating rate of the nickel strike bath is somewhat in excess of 0.05 mil/hr.

In the present process of plating upon non-metallic bodies, the utilization of the chemical nickel strike bath, preceding the utilization of the chemical nickel plating bath, is very advantageous as there is virtually no nickel plating initiation time (time required for the nickel plating upon the dispersed growth nuclei palladium particules to begin) involved in the use of the strike bath, and the adhesion of the nickel layer (the principal portion of which is deposited by the plating bath) upon the bodies is very much improved. Moreover, the nickel layer (really a nickel-phosphorus alloy layer) is ideally suited to receive the subsequent copper layer, as the electrodeposition of the copper is greatly simplified by the nickel layer of good conductivity. Furthermore, the bond between the copper, deposited electrically, and the nickel, deposited chemically, is remarkable, as there is absolutely no peeling, blistering, spalling, or separation of any kind, in every test that has yet been devised for studying this bond.

Thus, the present process has utility as the final step in the coating and decorating, with nickel, of various articles of manufacture formed essentially of non-metallic materials and an intermediate step in the coating and decorating, with copper or other electrodeposited metals, of such articles formed essentially of non-conductive materials.

While there has been described what is at present considered to be the preferred embodiment of the invention, it will be understood that various modifications may be made therein, and it is intended to cover in the appended claims all such modifications as fall within the true spirit and scope of the invention.

What is claimed is:

1. The process of applying a layer of copper upon the surface of a solid non-metallic body, which comprises exposing a fresh roughened surface of said body having incorporated therein and exposed thereon dispersed growth nuclei minute particles essentially comprising an element selected from the group consisting of cobalt, nickel, palladium, rhodium and ruthenium, contacting said fresh roughened surface with an aqueous chemical nickel strike bath during a sufficient time interval to effect a nickel strike upon said particles, said strike bath containing nickel ions and hypophosphite ions and ammonium ions and ortho-boric acid, the absolute concentration of nickel ions in said strike bath being in the approximate range 0.06 to 0.20 mole per liter, the molar ratio between nickel ions and hyphosphite ions in said strike bath being in the approximate range 0.2 to 0.6, the absolute concentration of ammonium ions in said strike bath being in the approximate range 0.04 to 0.20 mole per liter, the absolute concentration of ortho-boric acid in said strike bath being in the approximate range 0.015 to 0.030 mole per liter, the pH of said strike bath being in the approximate range 5.5 to 7.0, then contacting said surface with an aqueous chemical nickel plating bath of the nickel cation-hyphosphite anion type during a sufficient time interval to effect chemical plating of a nickel-phosphorus alloy upon the nickel strike previously deposited upon said particles and subsequent growth of the plating into a continuous alloy layer upon said surface, and then electrodepositing from an aqueous copper plating bath a copper layer upon said alloy layer.

2. The process of applying a layer of copper upon the surface of a sheet of non-metallic and electrical insulating material, which comprises exposing a fresh roughened surface of said sheet having incorporated therein and disposed thereon dispersed growth nuclei minute particles essentially comprising an element selected from the group consisting of cobalt, nickel, palladium, rhodium and ruthenium, contacting said fresh roughened surface with an aqueous chemical nickel strike bath during a sufficient time interval to effect a nickel strike upon said particles, said strike bath comprising nickel ions and hypophosphite ions and ammonium ions and ortho-boric acid, the absolute concentration of nickel ions in said strike bath being in the approximate range 0.06 to 0.20 mole per liter, the molar ratio between nickel ions and hypophosphite ions in said strike bath being in the approximate range 0.2 to 0.6, the absolute concentration of ammonium ions in said strike bath being in the approximate range 0.04 to 0.20 mole per liter, the absolute concentration of ortho-boric acid in said strike bath being in the approximate range 0.015 to 0.030 mole per liter, the pH of said strike bath being in the approximate range 5.5 to 7.0, then contacting said surface with an aqueous chemical nickel plating bath of the nickel cation-hypophosphite anion type during a sufficient time interval to effect chemical plating of a nickel-phosphorus alloy upon the nickel strike previously deposited upon said particles and subsequent growth of the plating into a continuous alloy layer upon said surface, and then electro-depositing from an aqueous copper plating bath a copper layer upon said alloy layer.

3. The process of producing a copper layer upon the surface of a solid non-metallic body, which comprises exposing a fresh roughened surface of said body, then contacting said body with a first aqueous solution of a palladium salt, then contacting said body with a second aqueous solution of a reducing agent in order to effect the chemical reduction of said palladium salt to metallic palladium so that dispersed minute metallic palladium particles are secured to said surface of said body, then contacting said body with an aqueous acid chemical nickel strike bath essentially comprising nickel ions and hypophosphite ions and ammonium ions and ortho-boric acid during a sufficient time interval to effect a nickel strike upon said particles, then contacting said body with an aqueous chemical nickel plating bath of the nickel cation-hypophosphite anion type during a sufficient time interval to effect chemical plating of nickel-phosphorus alloy upon the nickel previously deposited upon said particles and subsequent growth of the plating into a continuous alloy layer upon said surface of said body, and then electro-depositing from an aqueous copper plating bath a continuous copper layer upon said continuous alloy layer, whereby said alloy layer is securely bonded to said surface of said body and said copper layer is securely bonded to said alloy layer.

4. The process set forth in claim 3, wherein said chemical nickel strike bath is at a temperature of about 70° F. and said chemical nickel plating bath is at a temperature in the approximate range 200° F. to 210° F.

5. The process set forth in claim 3, wherein said aqueous chemical nickel strike bath comprises a solution of nickel sulfate, sodium hypophosphite, ammonium sulfate, and ortho-boric acid.

6. The process set forth in claim 3, wherein said electrodeposition of said copper layer is effected from a copper plating bath comprising an aqueous solution of copper sulfate, sulfuric acid, thiourea, molasses and a wetting agent.

7. An aqueous chemical nickel strike bath comprising nickel ions, hypophosphite ions, ammonium ions and ortho-boric acid; the absolute concentration of nickel ions in said bath being in the approximate range 0.06 to 0.20 mole per liter, the molar ratio between nickel ions and hypophosphite ions in said bath being in the approximate range 0.2 to 0.6, the absolute concentration of ammonium ions in said bath being in the approximate range 0.04 to 0.20 mole per liter, and the absolute concentration of ortho-boric acid in said bath being in the approximate range 0.015 to 0.030 mole per liter.

8. An aqueous chemical nickel strike bath comprising nickel ions, hypophosphite ions, ammonium ions and ortho-boric acid; the absolute concentration of nickel ions in said bath being in the approximate range 0.06 to 0.20 mole per liter, the molar ratio between nickel ions and hypophosphite ions in said bath being in the approximate range 0.2 to 0.6, the absolute concentration of ammonium ions in said bath being in the approximate range 0.04 to 0.20 mole per liter, the absolute concentration of ortho-boric acid in said bath being in the approximate range 0.015 to 0.030 mole per liter and the pH of said bath being in the approximate range 5.5 to 7.0.

9. An aqueous chemical nickel strike bath comprising nickel ions, hypophosphite ions, ammonium ions and ortho-boric acid; the absolute concentration of nickel ions in said bath being in the approximate range 0.06 to 0.20 mole per liter, the molar ratio between nickel ions and hypophosphite ions in said bath being about 1/2, the absolute concentration of ammonium ions in said bath being in the approximate range 0.04 to 0.20 mole per liter, the absolute concentration of ortho-boric acid in said bath being in the approximate range 0.015 to 0.030 mole per liter, and the pH of said bath being in the approximate range 5.5 to 7.0.

10. An aqueous chemical nickel strike bath comprising nickel ions, hypophosphite ions, ammonium ions and ortho-boric acid; the absolute concentration of nickel ions in said bath being about 0.09 mole per liter, the molar ratio between nickel ions and hypophosphite ions in said bath being about 0.5, the absolute concentration of ammonium ions in said bath being about 0.02 mole per liter, the absolute concentration of ortho-boric acid in said bath being about 0.02 mole per liter, the pH of said bath being about 5.8.

11. An aqueous chemical nickel strike bath comprising nickel ions and hypophosphite ions, the absolute concentration of nickel ions in said bath being in the approximate range 0.06 to 0.20 mole per liter, the molar ratio between nickel ions and hypophosphite ions in said bath being in the approximate range 0.2 to 0.6, said bath also containing ammonium sulfate in the approximate range 0.02 to 0.10 mole per liter and ortho-boric acid in the approximate range 0.015 to 0.030 mole per liter, the pH of said bath being in the approximate range 5.5 to 7.0.

12. The chemical nickel strike bath set forth in claim 7, and further including an exalting additive comprising ions of a simple short chain saturated aliphatic monocarboxylic acid selected from the group consisting of acetic, propionic, butyric and valeric acids.

13. The chemical nickel strike bath set forth in claim 7, and further including about 0.03 to 0.15 mole/liter of acetate ions.

References Cited in the file of this patent

UNITED STATES PATENTS 2,265,467 Alexander et al. ---------- Dec. 9, 1941

2,441,960 Eisler ------------------ May 25, 1948
2,532,283 Brenner et al. ------------- Dec. 5, 1950
2,532,284 Brenner et al. ------------ Dec. 5, 1950
2,646,456 Jacquier ---------------- July 21, 1953
2,662,957 Eisler -------------------Dec. 15, 1953
2,690,401 Gutzeit et al. ------------ Sept. 28, 1954
2,690,403 Gutzett et al. ------------ Sept. 28, 1954
2,699,424 Nieter ------------------ Jan. 11, 1955
2,699,425 Nieter ------------------ Jan. 11, 1955
2,774,688 Girard ----------------- Dec. 18, 1956
2,822,294 Gutzeit et al. -------------Feb. 4, 1958

FOREIGN PATENTS 562,046 Great Britain -------------June 15, 1944

OTHER REFERENCES

Blum and Hogaboom: Principles of Electroplating and Electroforming, 3rd edition, McGraw-Hill Book Company, New York (1949), pages 78–79.